United States Patent
Yang et al.

(10) Patent No.: US 9,335,353 B2
(45) Date of Patent: May 10, 2016

(54) ELECTRIC POWER CONSUMPTION MEASURING MECHANISM

(71) Applicant: General Electric Company, Schenectady, NY (US)

(72) Inventors: Sung Dong Yang, Seongham (KR); Dong Soo Shin, Seoul (KR); Dong Hun Lee, Gunpo-si (KR); Young Han Choi, Seoul (KR); Jae Seok Noh, Seoul (KR); Eun Yeong An, Seoul (KR)

(73) Assignee: General Electric Company, Schenectady, NY (US)

( * ) Notice: Subject to any disclaimer, the term of this patent is extended or adjusted under 35 U.S.C. 154(b) by 625 days.

(21) Appl. No.: 13/772,392

(22) Filed: Feb. 21, 2013

(65) Prior Publication Data

US 2014/0236505 A1  Aug. 21, 2014

(51) Int. Cl.
*G01R 21/133* (2006.01)
*G01R 35/04* (2006.01)
*G01R 19/25* (2006.01)

(52) U.S. Cl.
CPC ........ *G01R 21/1333* (2013.01); *G01R 19/2513* (2013.01); *G01R 21/133* (2013.01); *G01R 35/04* (2013.01)

(58) Field of Classification Search
CPC ............. G01R 19/2513; G01R 21/133; G01R 21/1333; G01R 35/04
USPC .................. 702/60, 61, 64; 324/74, 142, 157; 341/143; 700/295
See application file for complete search history.

(56) References Cited

U.S. PATENT DOCUMENTS

| | | | |
|---|---|---|---|
| 4,360,879 A | 11/1982 | Cameron | |
| 4,884,021 A | 11/1989 | Hammond et al. | |
| 4,922,189 A | 5/1990 | Dunn et al. | |
| 4,980,634 A | 12/1990 | Mallinson | |
| 5,589,764 A | 12/1996 | Lee | |
| 6,417,792 B1 | 7/2002 | King et al. | |
| 6,526,359 B1 | 2/2003 | Dzombak et al. | |
| 6,555,997 B1 | 4/2003 | De Vries et al. | |
| 7,031,854 B2 | 4/2006 | Lin et al. | |
| 2010/0298998 A1* | 11/2010 | Hamilton, II | G06F 1/30 700/295 |
| 2012/0191395 A1 | 7/2012 | Bandsmer | |

FOREIGN PATENT DOCUMENTS

EP  0420545 A2  4/1991

OTHER PUBLICATIONS

International Search Report and Written Opinion issued in connection with corresponding PCT Application No. PCT/US2014/013562 dated Apr. 25, 2014.

* cited by examiner

*Primary Examiner* — John H Le
(74) *Attorney, Agent, or Firm* — Dority & Manning, P.A.

(57) ABSTRACT

A system and method of measuring power consumption in an appliance is provided. An electrical characteristic of a power signal, such as a voltage component and/or a current component, can be detected at the appliance. The detected electrical characteristic can be processed using a signal processor. During signal processing, the detected electrical characteristic can be shifted based on a predetermined threshold and converted to a digital signal. An electrical characteristic offset can be determined based on an average electrical characteristic value of a plurality of detected electrical characteristics. The difference between the electrical characteristic offset value and an instantaneously detected electrical characteristic value can be used to determine power consumption of the appliance.

18 Claims, 5 Drawing Sheets

ELECTRIC POWER CONSUMPTION MEASURING MECHANISM

FIELD OF THE INVENTION

The present disclosure relates to a home appliance and more particularly to an improved method of measuring power consumption of the home appliance.

BACKGROUND OF THE INVENTION

The increasing demand for energy and the use of finite resources for energy production have led to the use of increased technology for the production, transmission, distribution and consumption of energy in order to make, distribute and use energy more efficiently and wisely. Previously, a utility charged a flat rate for power consumption. However, as energy prices increase and energy use fluctuates throughout the day, utilities have become more sophisticated with regard to variable rates relating to the energy supplied to customers.

Power consumption, and more particularly power consumption of household consumer appliances at a location is generally measured using a utility usage meter. Utility usage meters are limited to monitoring the overall power consumption at a single location. They are unable to distinguish the power consumption for each individual appliance. Moreover, utility usage meters require additional hardware and an increase in circuit design complexity.

Thus, a need exists for an improved power consumption measuring system. A system and method that can measure power consumption of a single home appliance would be particularly useful.

BRIEF DESCRIPTION OF THE INVENTION

Aspects and advantages of the invention will be set forth in part in the following description, or may be apparent from the description, or may be learned through practice of the invention.

One exemplary aspect of the present disclosure is directed to a computer implemented method of measuring power consumption in an appliance. The method can include detecting an instantaneous electrical characteristic component of a power signal; determining an electrical characteristic offset based on an average value of a plurality of electrical characteristic components over a predetermined time interval; determining a difference between the instantaneous electrical characteristic component and the electrical characteristic offset; and calculating power consumption of the appliance based on the difference between the instantaneous electrical characteristic component and the electrical characteristic offset.

Another exemplary aspect of the present disclosure is directed to a home appliance. The home appliance can include an electrical characteristic sensor configured to detect an instantaneous electrical characteristic component of a power signal and a signal processor coupled to the electrical characteristic sensor. The signal processor can be configured to process the instantaneous electrical characteristic component of the power signal. The home appliance can further include a controller coupled to the signal process. The controller can be configured to determine an electrical characteristic offset based on an average value of a plurality of electrical characteristic components over a predetermined time interval, determine a difference between the instantaneous electrical characteristic component detected at the electrical characteristic sensor and the electrical characteristic offset determined, and calculate power consumption of the appliance based on the difference between the instantaneous electrical characteristic component and the electrical characteristic offset.

Still another exemplary aspect of the present disclosure is directed to a home appliance. The home appliance can include a voltage signal sensor configured to detect an instantaneous voltage component of a power signal, a current signal sensor configured to detect an instantaneous current component of the power signal, and a signal processor coupled to the voltage signal sensor and the current signal sensor. The signal processor can be configured to process the instantaneous voltage component and the instantaneous current component of the power signal. The home appliance can further include a controller coupled to the signal processor. The controller can be configured to determine a voltage offset based on an average value of a plurality of voltage components of the power signal, determine a current offset based on an average value or a median value of a plurality of current components of the power signal, determine a difference between the instantaneous voltage component of the power signal and the voltage offset, determine a difference between the instantaneous current component of the power signal, and calculate power consumption of the appliance based on the difference between the instantaneous voltage component and the voltage offset and the difference between the instantaneous current component and the current offset.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention covers such modifications and variations as come within the scope of the appended claims and their equivalents.

Generally, the present disclosure relates to a system and method of measuring power consumption in an appliance. An electrical characteristic of a power signal, such as a voltage component and/or a current component, can be detected at the appliance. The detected electrical characteristic can be processed using a signal processor. During signal processing, the detected electrical characteristic can be shifted based on a predetermined threshold and converted to a digital signal. An electrical characteristic offset can be determined based on an average or median electrical characteristic value of a plurality of detected electrical characteristics. The difference between the electrical characteristic offset value and an instantaneously detected electrical characteristic value can be used to determine power consumption of the appliance.

Figure 1:
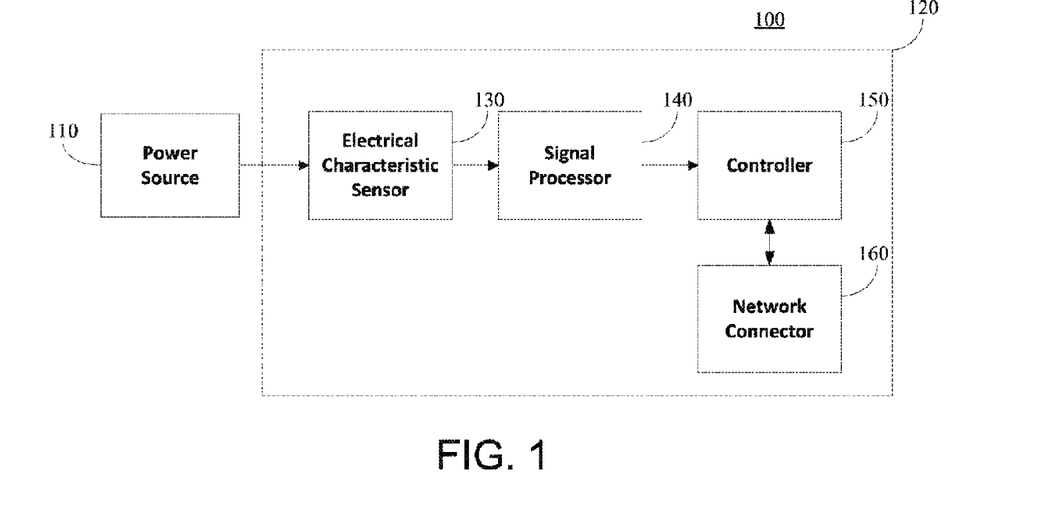
FIG. 1 depicts a block diagram of an appliance according to an exemplary embodiment of the present disclosure.

FIG. 1 illustrates an exemplary power measurement system 100 according to an exemplary embodiment of the present disclosure. The power measurement system 100 can include a power source 110 and a home appliance 120. The home appliance 120 can be any home appliance that consumes electrical energy, such as an air conditioner, a refrigerator, a washer, a dryer, an oven, a cooktop, a range, a hot water heater, or a HVAC system.

Power source 110 can be a two phase, 240 volt alternating current (AC) power source that is supplied to residential premises from energy production sources such as an electric utility supplier. However, any other type of power source can be used, such as a single phase 120 volt AC power source.

Home appliance 120 is coupled to the power source 110 and can include an electrical characteristic sensor 130, a signal processor 140, a controller 150, and a network interface 160. Electrical characteristic sensor 130 can be a single sensor configured to detect a single electrical characteristic of the power signal supplied to the appliance 120 from the power source 110. Alternatively, the electrical characteristic sensor 130 can be a single sensor or multiple sensors configured to detect a plurality of electrical characteristics of the power signal. For instance, the electrical characteristic sensor 130 can be configured to sense a voltage component and a current component of the power signal. In one implementation, the appliance can include two electrical characteristic sensors where one sensor can detect the voltage component and one sensor can detect the current component of the power signal.

Figure 2:
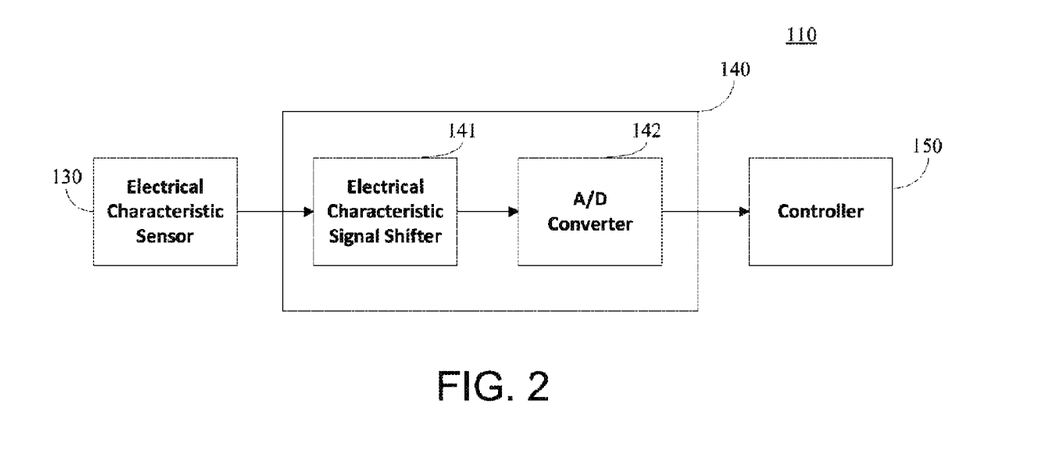
FIG. 2 depicts a block diagram of an appliance according to an exemplary embodiment of the present disclosure.

Electrical characteristic sensor 130 can provide the detected electrical characteristic component of the power signal to a signal processor 140 to process the detected signal. As illustrated in FIG. 2, signal processor 140 can include an electrical characteristic signal shifter 141 and an analog to digital (A/D) converter 142. The detected electrical characteristic component can be an AC signal. Electrical characteristic signal shifter 141 can shift the detected electrical characteristic component signal a predetermined amount such that the entire AC signal is within a positive signal range.

Controller 150 can be positioned in any location with the appliance 120. In addition, controller 150 can be the only controller in the appliance 120 such that controller 150 controls all operations of the appliance. Alternatively, controller 150 can be a sub-controller coupled to the overall appliance controller. If controller 150 is a sub-controller, it can be located with the overall appliance controller or be separate from the overall appliance controller.

By way of example, any/all of the "controllers" discussed in this disclosure can include a memory and one or more processing devices such as microprocessors, CPUs or the like, such as general or special purpose microprocessors operable to execute programming instructions or micro-control code associated with operation of an appliance 120. The memory can represent random access memory such as DRAM, or read only memory such as ROM or FLASH. In one embodiment, the processor executes programming instructions stored in memory. The memory can be a separate component from the processor or can be included onboard within the processor. Alternatively, the controller might also be constructed without using a microprocessor, using a combination of discrete analog and/or digital logic circuitry (such as switches, amplifiers, integrators, comparators, flip-flops, AND gates, and the like) to perform control functionality instead of relying upon software.

In a particular embodiment of the present disclosure, the controller 150 can determine power consumption of the appliance 120 and control the appliance 120 based on the determined power consumption. For instance, the controller 150 can receive a signal indicative of an instantaneous electrical characteristic component such as a voltage component and/or a current component.

The controller 150 can further determine an electrical characteristic offset based on an average of a plurality of detected electrical characteristic component values. An average determination can be any suitable technique for normalizing a range of measurement values including mean, median, and/or mode determinations. After each electrical characteristic component value is detected, it is saved in the memory of the controller 150 and a counter can be incremented. The number of electrical characteristic components used to determine the average or median value can be a predetermined sampling value. After the counter reaches the predetermined sampling value, the controller 150 compiles the saved electrical characteristic component values and determines the average or median value of those values. The average or median value can be set as an electrical characteristic offset value.

Controller 150 can calculate an electrical characteristic usage value based on a detected instantaneous electrical characteristic component and the electrical characteristic offset value. For instance, a voltage and/or a current component of the power signal can be detected by electrical characteristic sensor 130 and processed using signal processor 140. The processed signal of the instantaneous voltage and/or current component can be provided to the controller 150. The controller 150 can determine the difference between the instantaneous voltage and/or current component and the respective offset value ($V_{Dif}$, $I_{Dif}$).

Power consumption of the appliance 100 can be calculated based on the difference between the instantaneous component and the offset value. For example, the power consumption can be calculated using the equation $P = V_{Dif} \times I_{Dif} \times \Delta t$, where $\Delta t$ is a predetermined value. Alternatively, the power consumption can be determined using one of the determined differences between the instantaneous voltage or current component and the respective offset value ($V_{Dif}$, $I_{Dif}$). In that case, the other electrical characteristic usage value not computed can be a predetermined value or an instantaneous electrical characteristic component value.

The power consumption values can be accumulated to determine overall power consumption. The controller 150 can use these power consumption values to control the appliance 120. Alternatively, the controller 150 can send this information to a remote device using network interface 160.

Network interface 160 can be coupled with transmitting elements to communicate information over a network. Any type of network interface 160 can be implemented such as wireless, wired, ZigBee, Bluetooth, RF, etc. Receiving elements can also be coupled to the network connector to receive information over the network.

Controller 150 can communicate the determined power consumption values over the network using network interface 160. For instance, the controller 150 can send the accumulated power consumption information to a remote device such as a home energy manager or a device associated with the utility supplier. The remote device can use the power consumption information for various calculations such as billing for power usage, peak usage and control, off-peak usage and control, etc. In addition, the remote device can communicate information to the appliance over the network.

While the elements used in the method of measuring power consumption for an appliance are illustrated in FIGS. 1 and 2 as included in the appliance 120, the electrical characteristic sensor 130, signal processor 140, and/or controller 150 for calculating power consumption of the appliance 120 can be separate from and communicate with appliance 120.

FIGS. 3-6 illustrate a flow chart of exemplary methods 200, 300, 400, and 600 according to exemplary embodiments of the present disclosure. The methods 200, 300, 400, and 500 will be discussed with reference to the exemplary power measurement system illustrated in FIGS. 1 and 2. However, the methods 200, 300, 400, and 500 can be implemented with any suitable home appliance. In addition, although FIGS. 3-6 depict steps performed in a particular order for purposes of illustration and discussion, the methods discussed herein are not limited to any particular order or arrangement. One skilled in the art, using the disclosures provided herein, will appreciate that various steps of the methods can be omitted, rearranged, combined and/or adapted in various ways.

Figure 3:
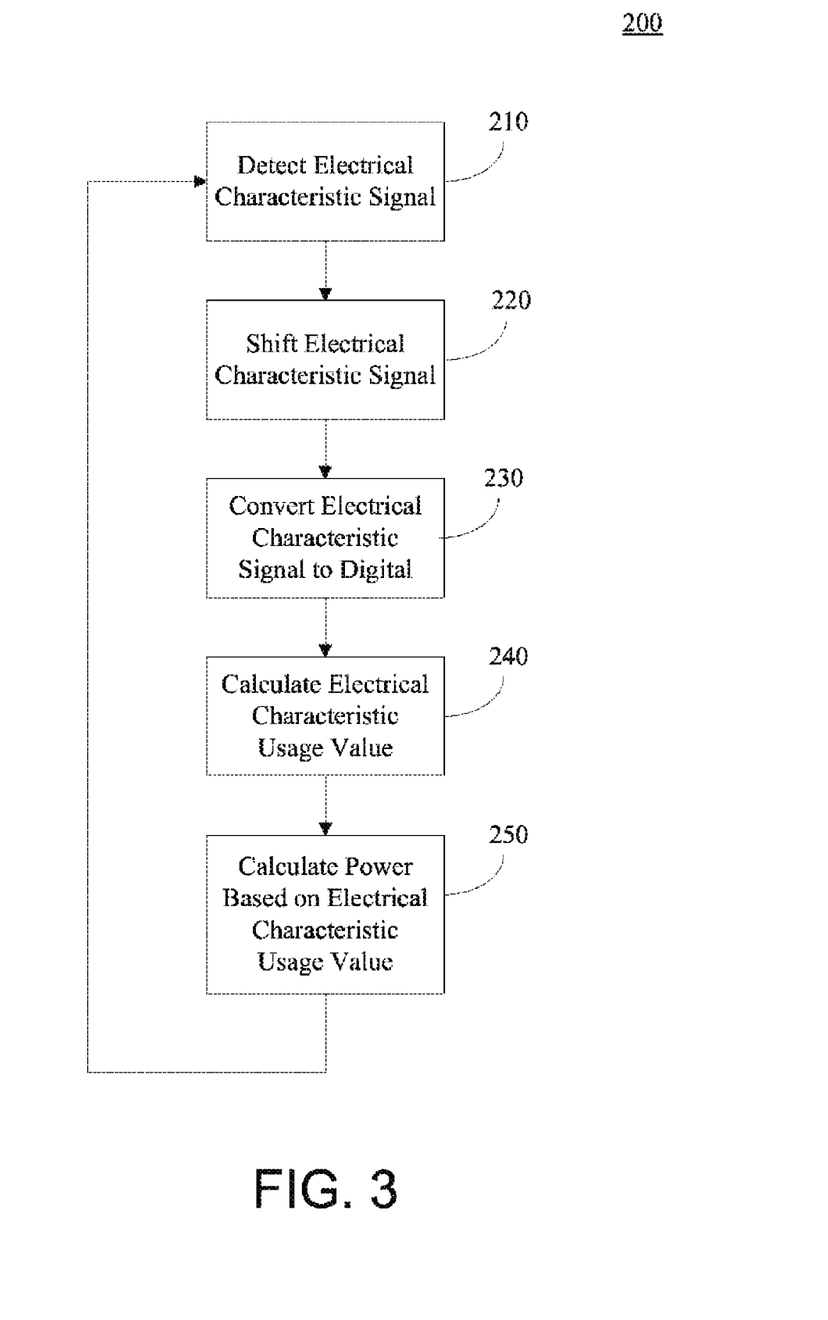
FIG. 3 depicts a flow chart of a method according to an exemplary embodiment of the present disclosure.

FIG. 3 provides a flow chart of an exemplary method 200 of calculating power consumption of a home appliance according to an exemplary embodiment of the present disclosure. An electrical characteristic signal (voltage or current) can be detected at (210) and shifted a predetermined amount in (220) such that the entire electrical characteristic signal has a positive value. In (230), the shifted electrical characteristic signal is converted to a digital signal. The electrical characteristic usage value ($V_{Dif}$ or $I_{Dif}$) is calculated in (240) based on the difference between an instantaneous electrical characteristic usage value and an electrical characteristic offset value. An exemplary technique for determining an electrical characteristic offset value will be discussed with respect to FIG. 4. Power consumption of the appliance can be calculated based on the electrical characteristic usage value in (250). For instance, the power consumption can be calculated using the following equation: $P=V_{Dif} \times I_{Dif} \times \Delta t$, where $\Delta t$ is a predetermined value. In addition, the calculated power consumption value can be used to control the appliance 120.

Figure 4:
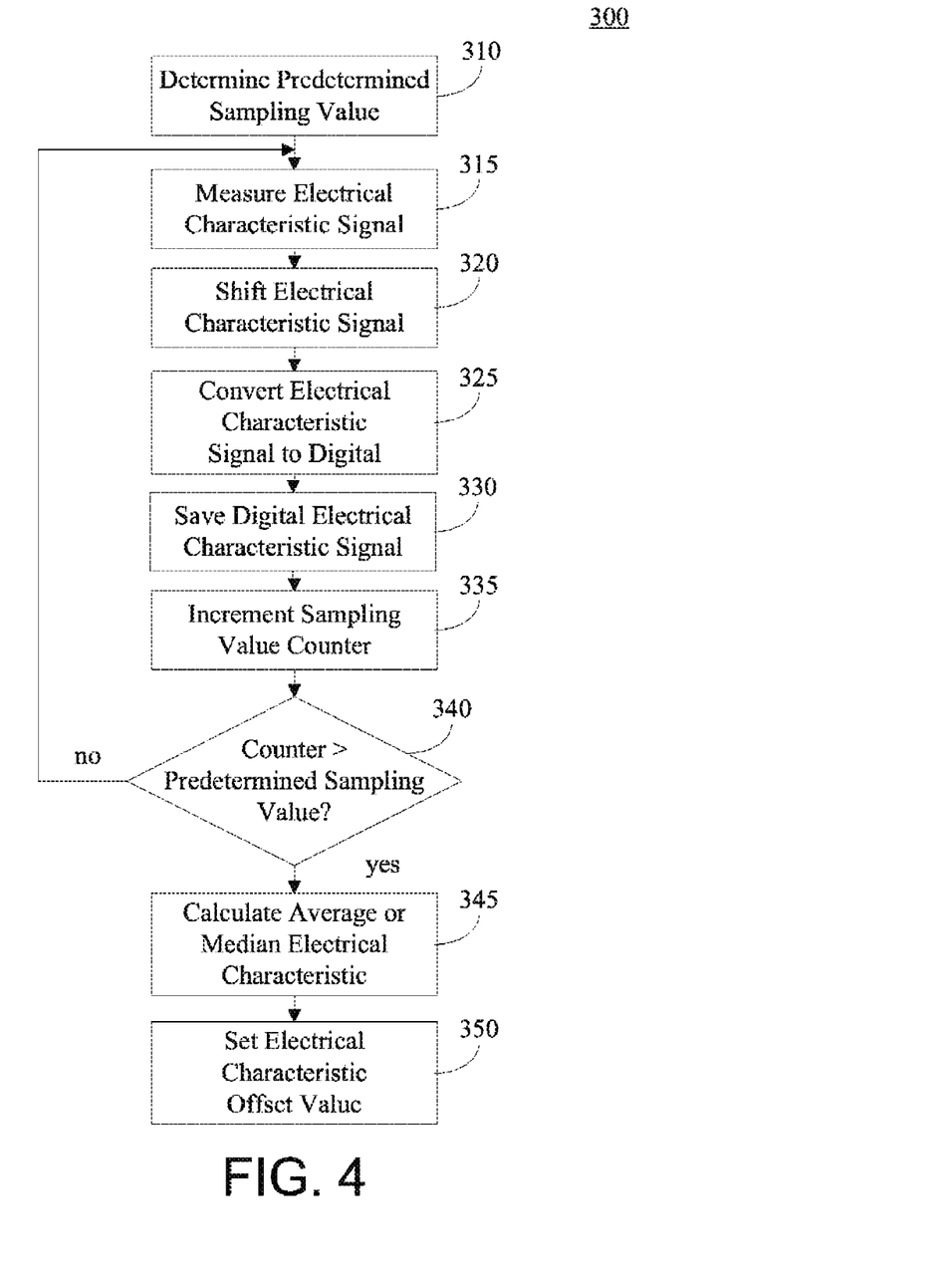
FIG. 4 depicts a flow chart of a method according to an exemplary embodiment of the present disclosure.

FIG. 4 provides a flow chart of an exemplary method 300 of determining an electrical characteristic offset value. A predetermined sampling value can be determined in (310) based on a desired number of electrical characteristic samples desired to be included in the calculation of an average or median electrical characteristic value. In (315), an electrical characteristic signal can be detected and shifted in (320). The shifted electrical characteristic signal can be converted to a digital signal in (325) and saved to a memory in controller 150 in (330). A counter can be incremented in (335) and the current counter value is compared to the predetermined sampling value in (340). When the current counter value is greater than the predetermined sampling value, an average or median electrical characteristic value is determined based on the saved electrical characteristic values in (345). The average or median electrical characteristic value is then set as the electrical offset value in (350).

Figure 5:
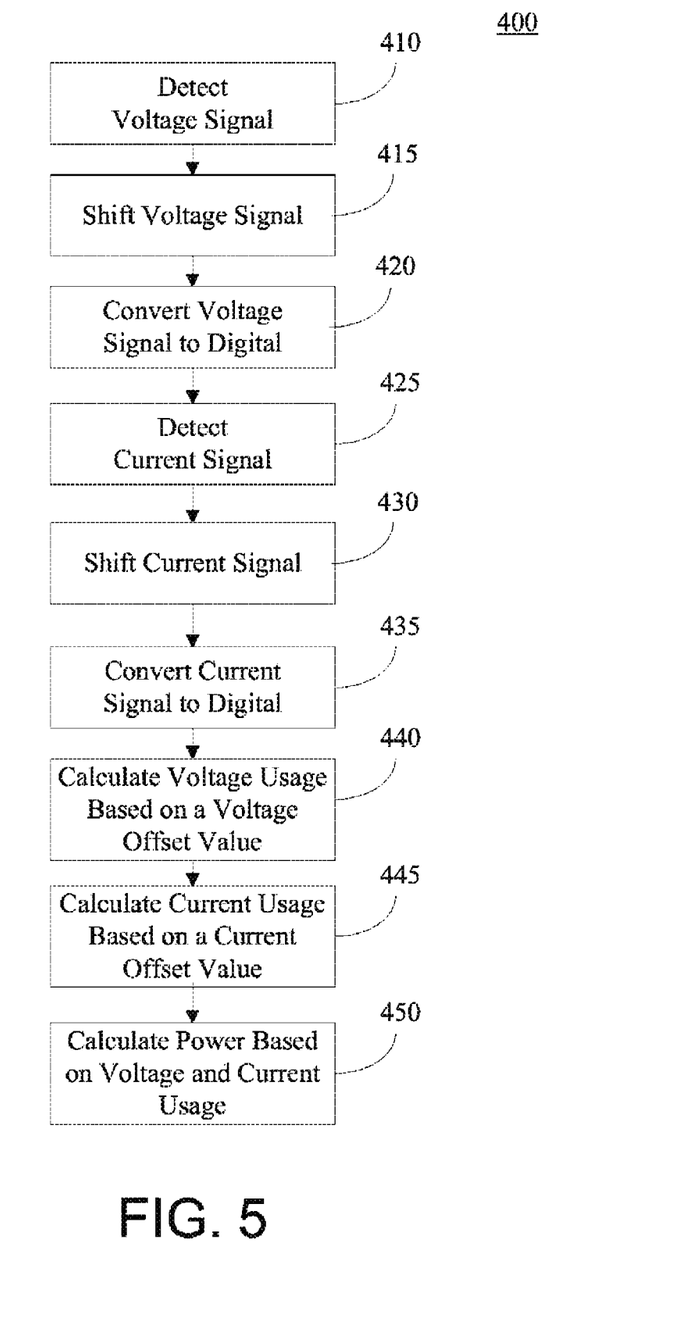
FIG. 5 depicts a flow chart of a method according to an exemplary embodiment of the present disclosure.

FIG. 5 provides a flow chart of an exemplary method 400 of calculating power consumption of a home appliance according to an exemplary embodiment of the present disclosure. A voltage signal can be detected at (410), shifted in (415), and converted to a digital signal in (420). Likewise, a current signal can be detected at (425), shifted in (430), and converted to a digital signal in (435). The detection and processing of the voltage and current signals can be performed simultaneously or concurrently with either signal processed and detected first. Alternatively, the voltage and current signals can both be detected before processing of the signals occurs.

Voltage usage ($V_{Dif}$) can be calculated based on a voltage offset value in (440) and a current usage ($I_{Dif}$) can be calculated based on a current offset value in (445). An exemplary technique for determining a voltage offset value and a current offset value will be discussed with respect to FIG. 6. The power consumption can be calculated based on the voltage usage and the current usage values in (450). For instance, the power consumption can be calculated using the following equation: $P=V_{Dif} \times I_{Dif} \times \Delta t$, where $\Delta t$ is a predetermined value. In addition, the calculated power consumption value can be used to control the appliance 120.

Figure 6:
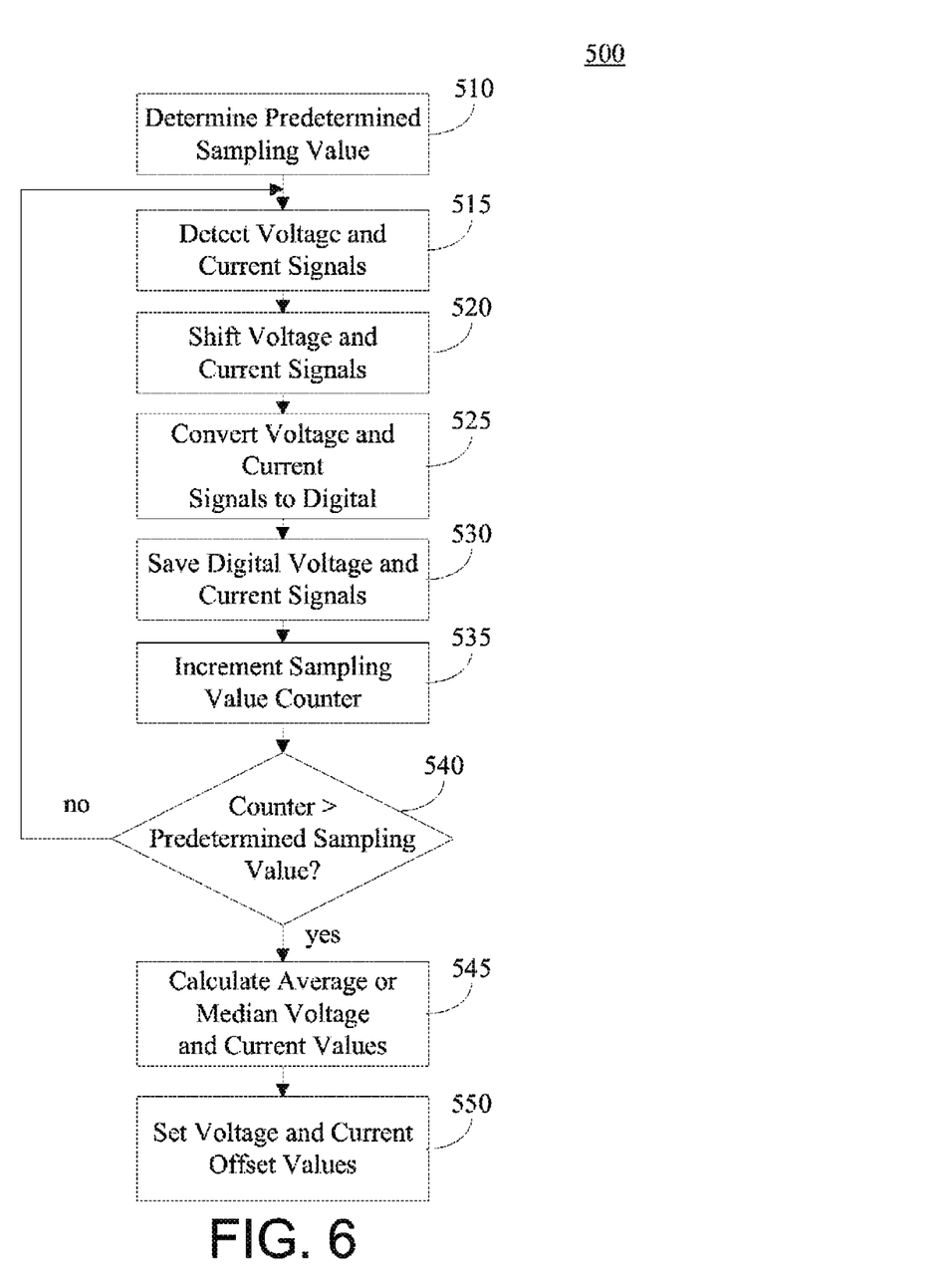
FIG. 6 depicts a flow chart of a method according to an exemplary embodiment of the present disclosure.

FIG. 6 provides a flow chart of an exemplary method 500 of determining a voltage offset value and a current offset value. A predetermined sampling value can be determined in (510) based on a desired number of electrical characteristic samples desired to be included in the calculation of an average or median electrical characteristic value. In (515), the voltage and current signals can be detected and shifted in (520). The shifted voltage and current signal can be converted to a digital signal in (525) and saved to a memory in controller 150 in (530). A counter can be incremented in (535) and the current counter value can be compared to the predetermined sampling value in (540). When the current counter value is greater than the predetermined sampling value, an average or median voltage value and current value are determined based on the saved voltage signal values and saved current signal values in (545). The average or median voltage values and current values are then set as voltage offset value and current offset value in (550).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A computer implemented method of measuring power consumption in an appliance, comprising:
   detecting, by an electrical characteristic sensor of the appliance, an instantaneous electrical characteristic of a power signal of the appliance, wherein the electrical characteristic of the power signal comprises at least one of a voltage and a current of the power signal;
   determining, by the electrical characteristic sensor of the appliance, a first plurality of samples of the electrical characteristic of the power signal over a first time interval;

shifting, by a signal processor of the appliance, each of the first plurality of samples of the electrical characteristic of the power signal by a shift value to obtain a first plurality of shifted samples of the electrical characteristic, wherein shifting the first plurality of samples results in the first plurality of shifted samples comprising only positive values;

determining, by a controller of the appliance, an average value of the first plurality of shifted samples of the electrical characteristic of the power signal;

determining, by the controller of the appliance, an electrical characteristic offset based on the average value of the first plurality of shifted samples of the electrical characteristic of the power signal;

collecting, by the electrical characteristic sensor of the appliance, a second plurality of samples of the electrical characteristic of the power signal over a second time interval;

shifting, by the signal processor of the appliance, each of the second plurality of samples of the electrical characteristic by the shift value to obtain a second plurality of shifted samples of the electrical characteristic, wherein shifting the second plurality of samples results in the second plurality of shifted samples comprising only positive values;

determining, by the controller of the appliance, a plurality of differences respectively between the second plurality of shifted samples and the electrical characteristic offset; and calculating, by the controller of the appliance, a power consumption of the appliance during the second time interval based on the plurality of differences between the second plurality of shifted samples and the electrical characteristic offset.

2. The method as in claim 1, further comprising controlling the appliance based on the calculated power consumption.

3. The method as in claim 1, further comprising converting, by an analog to digital converter of the appliance, each of the second plurality of shifted samples to a digital value before determining a difference between each of the second plurality of shifted samples and the electrical characteristic offset.

4. The method as in claim 1, wherein detecting an instantaneous electrical characteristic component of the power signal comprises both detecting the voltage of the power signal and detecting the current of the power signal.

5. The method as in claim 1, wherein the calculated power consumption is communicated over a communications network.

6. The method as in claim 1, wherein determining the average value of the first plurality of shifted samples comprises determining a median value of the first plurality of shifted samples of the electrical characteristic component over a predetermined time interval.

7. The method as in claim 1, wherein determining the average value of the first plurality of shifted samples comprises determining a mean value of the first plurality of shifted samples of the electrical characteristic component over a predetermined time interval.

8. A home appliance comprising:

an electrical characteristic sensor configured to detect a first plurality of samples of an instantaneous electrical characteristic of a power signal of the appliance over a first time interval, wherein the instantaneous electrical characteristic of the power signal comprises at least one of a voltage of the power signal and a current of the power signal;

a signal processor coupled to the electrical characteristic sensor, the signal processor configured to shift each of the first plurality of samples of the electrical characteristic of the power signal by a shift value to obtain a first plurality of shifted samples of the electrical characteristic, wherein the first plurality of shifted samples comprises only positive values; and a controller coupled to the signal processor, the controller configured to determine an average value of the first plurality of shifted samples of the electrical characteristic of the power signal and configured to determine an electrical characteristic offset based on the average value of a plurality of electrical characteristic components;

wherein the electrical characteristic sensor is further configured to collect a second plurality of samples of the electrical characteristic of the power signal over a second time interval;

wherein the signal processor is further configured to shift each of the second plurality of samples of the electrical characteristic by the shift value to obtain a second plurality of shifted samples of the electrical characteristic, wherein the second plurality of shifted samples comprises only positive values;

wherein the controller is further configured to determine a plurality of differences respectively between the second plurality of shifted samples of the electrical characteristic and the electrical characteristic offset; and wherein the controller is further configured to calculate a power consumption of the appliance over the second time interval based on the plurality of differences between the second plurality of shifted samples and the electrical characteristic offset.

9. The home appliance as in claim 8, wherein the controller is further configured to control the appliance based on the calculated power consumption.

10. The home appliance as in claim 8, wherein the signal processor converts each of the second plurality of shifted samples of the instantaneous electrical characteristic component of the power signal to a digital value before determining the plurality of differences respectively between the second plurality of shifted samples and the electrical characteristic offset.

11. The home appliance as in claim 8, wherein the electrical characteristic sensor comprises a voltage sensor and a current sensor.

12. The home appliance as in claim 8, further comprising a network connector configured to couple the home appliance to a communications network.

13. The home appliance as in claim 8, wherein the average value of the first plurality of shifted samples comprises a median value or a mean value of the first plurality of shifted samples; and wherein the controller is configured to set the electrical characteristic offset equal to the average value of the first plurality of shifted samples.

14. A home appliance comprising:

a voltage signal sensor configured to detect an instantaneous voltage of a power signal;

a current signal sensor configured to detect an instantaneous current of the power signal;

a signal processor coupled to the voltage signal sensor and the current signal sensor, the signal processor configured to:

determine a first plurality of samples of the voltage of the power signal and the current of the power signal over a first time interval; and shift each of the first plurality of samples of the voltage and the current of the power signal by respective shift values to obtain a first plurality of shifted samples of the voltage and the current of the power signal, wherein the first plurality of shifted samples comprise only positive values; and a controller coupled to the signal processor, the controller configured to:
  determine an average voltage value of the first plurality of shifted samples of the power signal;
  determine an average current value of the first plurality of shifted samples of the power signal;
  determine a voltage offset based on the average voltage value of the first plurality of shifted samples
  determine a current offset based on the average current value of the first plurality of shifted samples;
  determine a first plurality of differences respectively between a second plurality of shifted samples of the voltage of the power signal and the voltage offset;
  determine a second plurality of differences respectively between a second plurality of shifted samples of the current of the power signal and the current offset; and
  calculate power consumption of the appliance based on the first plurality of differences respectively between the second plurality of shifted samples of the voltage and the voltage offset and the second plurality of differences respectively between the second plurality of shifted samples of the current and the current offset.

15. The home appliance as in claim 14, wherein the controller is further configured to control the appliance based on the calculated power consumption.

16. The home appliance as in claim 14, wherein the signal processor converts each of the second plurality of shifted samples of the voltage of the power signal to a digital voltage value and converts each of the second plurality of shifted samples of the current of the power signal to a digital current value before the controller determines the first and the second plurality of differences.

17. The home appliance as in claim 14, further comprising a network connector configured to couple the home appliance to a communications network.

18. The home appliance of claim 14, wherein the average voltage value comprises a mean voltage value; and wherein the average current value comprises a mean current value.

\* \* \* \* \*